United States Patent [19]
Sakurai

[11] Patent Number: 6,078,104
[45] Date of Patent: *Jun. 20, 2000

[54] CARRIER FILM AND INTEGRATED CIRCUIT DEVICE USING THE SAME AND METHOD OF MAKING THE SAME

[75] Inventor: Kazunori Sakurai, Suwa, Japan

[73] Assignee: Seiko Epson Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/020,546

[22] Filed: Feb. 9, 1998

[30] Foreign Application Priority Data

Feb. 17, 1997 [JP] Japan ................................. 9-032471
Oct. 13, 1997 [JP] Japan ................................. 9-278900

[51] Int. Cl.$^7$ ............................................... H01L 23/48
[52] U.S. Cl. ..................... 257/738; 257/737; 257/778; 257/780
[58] Field of Search .............................. 257/691, 692, 257/693, 694, 734, 736, 737, 738, 772, 773, 778, 780, 781

[56] References Cited

U.S. PATENT DOCUMENTS 5,506,756 4/1996 Haley ........................ 257/693
5,777,391 7/1998 Nakamura et al. ................ 257/778

FOREIGN PATENT DOCUMENTS 8-83818 3/1996 Japan .

OTHER PUBLICATIONS

Japanese Patent Abstract No. 07–249654, Sep. 26, 1995.
Japanese Patent Abstract No. 05–226409, Sep. 3, 1993.

*Primary Examiner*—Tom Thomas
*Assistant Examiner*—Ori Nadav
*Attorney, Agent, or Firm*—Oliff & Berridge, PLC

[57] ABSTRACT

A film, on which external electrodes and wire leads are disposed, is divided into two regions. A first region in which an integrated circuit element is disposed and a second region external to the first region. Connection holes are provided in a border area between the first and second regions for connecting the integrated circuit element and electrodes. External electrodes are provided on the first and second regions for connecting to an external substrate. The external electrodes are disposed to form a common matrix. When connecting external electrodes to an external substrate, connections to the external substrate are made in a region corresponding to an integrated circuit element.

13 Claims, 3 Drawing Sheets

CARRIER FILM AND INTEGRATED CIRCUIT DEVICE USING THE SAME AND METHOD OF MAKING THE SAME

BACKGROUND OF THE INVENTION

1. Field of Invention

The invention relates to a carrier film and an integrated circuit device using the same and a method of making the same.

2. Description of Related Art

Integrated circuit devices (hereinafter referred to as BGA-T) using conventional carrier films, including the one shown in FIGS. 4 and 5, are known. FIG. 4 is a plan view of the BGA-T of the related art, and FIG. 5 is a cross-sectional view taken along line 101-102 of FIG. 4. A carrier film to be used in the BGA-T defines a device hole 2 in which an integrated circuit element 1 is disposed. Inner leads 4, to be connected to electrodes 3 of the integrated circuit element 1, extend into the device hole 2 in the form of cantilevers. Normally, a film 5 is formed from heat-resistant resin, such as polyimide resin. External electrodes (external terminals) 6 are disposed in a plane on one surface of the film 5. Solder balls or gold-plated copper bumps are used as the external electrodes 6. The inner leads 4, to be connected to the electrodes 3 of the integrated circuit element 1, extend on the film 5, defining wire leads 7 that are connected to the external electrodes 6. After the inner leads 4 of the integrated circuit element 1 are connected to the electrodes 6 of the carrier film, the integrated circuit element 1, the inner leads 4 within the device hole 2 and portions of the film 5 adjacent the device hole are coated with liquid sealing resin 8, and the liquid resin is heated and hardened.

The BGA-T finished in this manner is placed on an external substrate which is printed with solder paste at locations corresponding to the external electrodes 6, and then subjected to a reflow process so that it is mounted on the external substrate.

However, in the conventional structure shown in FIGS. 4 and 5, no film exists in a region of the device hole 2 where the integrated circuit element 1 is positioned, that is, there is a gap around the circuit device 1 to the edge of the device hole 2, the inner leads 4 connected to the electrodes 3 of the integrated circuit element 1 extend only from the film 5 that is located outside of the integrated circuit element 1. The inner leads 4 are connected to the external electrodes 6 through the wire leads 7. As a consequence, external electrodes cannot be disposed in a region corresponding to the device hole 2 where the integrated circuit element 1 is located.

In order to increase the mounting density, it is necessary to dispose as many external electrodes 6 as possible in an area that is taken by the package and connect them to an external substrate. However, when the conventional BGA-T is connected to an external substrate, the region corresponding to the device hole 2 is wasted.

Japanese laid-open patent application HEI 8-83818 describes that a carrier film is divided into a first region for disposing a semiconductor circuit device and a second region about the first region, and external electrodes are disposed on both of the regions. In the carrier film described in Japanese laid-open patent application HEI 8-83818, the external electrodes in the second region are disposed in a staggered manner. As a consequence, if the size of an integrated circuit differs, a socket and a substrate specifically acceptable to the arrangement of the external electrodes are required when the integrated circuit device is examined. It is troublesome to change and maintain these elements, and the work required for the examination process is complicated.

SUMMARY OF THE INVENTION

The invention has been made to solve the above-described problems of the conventional technology, and the objects of the invention are to increase the mounting density and to simplify the examination process.

To solve the above-described problems, a carrier film or a carrier film of a semiconductor apparatus, in accordance with the invention, includes a film defining a connection hole and a plurality of inner leads to be connected to electrodes of an integrated circuit element that are disposed to protrude in the connection hole defined in the film. The inner leads extend on the film to define wire leads, and the wire leads are connected to external electrodes disposed in a plane on one surface of the film. In the carrier film, the film is divided into a first region in which the integrated circuit element is disposed and a second region external to the first region, and the connection hole is defined in a border area between the first region and the second region along the integrated circuit element. The external electrodes are provided on the first region and the second region, and the electrodes on the first region and the second region are disposed in the same matrix.

With the structure formed in the above-described manner, external electrodes can be disposed in an area corresponding to a conventional device hole section, and therefore connection to an external substrate can be made in a region corresponding to an integrated circuit element. Accordingly, the number of external electrodes in an area occupied by the package is substantially increased, and many more connections can be made in a specified mounting area as compared to the conventional structure. Moreover, because the same process required for the conventional structure can be used for manufacture, mounting with substantially higher-density is realized with the same number of steps as required for the conventional structure without requiring any new techniques. Further, the external electrodes in the first region and the external electrodes in the second region are disposed in a common matrix. As a result, even when the size of an integrated circuit element differs, the same socket and the same substrate can be used to examine the integrated circuit device. Accordingly, the socket and the substrate are not required to be changed, and therefore the examination procedure is simplified.

Preferably, the connection hole has a width W that is defined by $W=(P-D)$ to $(2P-D)$, where D is a diameter of the external electrode and P is a pitch between adjacent ones of the external electrodes.

A thus formed electrode connection hole occupies only an area corresponding to one row of external electrodes. As a result, the number of external electrodes is maximized and the mounting density is increased without any problems in the connection between electrodes of the integrated circuit element and the external electrodes.

The number of the external electrodes formed in the first region is preferably less than the number of the external electrodes formed in the second region. By this structure, the external electrodes in the first region and the external electrodes in the second region are disposed in the same pitch. Accordingly, a mounting substrate and an examination socket can be commonly used, and the size of an integrated circuit element can be reduced to the minimum.

Furthermore, the electrodes of the integrated circuit element are disposed in the matrix formed by the external electrodes. In other words, the electrodes of the integrated circuit element and the external electrodes can be disposed in a common matrix. By this structure, the external electrodes and the electrodes of the integrated circuit element have the same arrangement pitch, and the package of the integrated circuit device can be miniaturized.

BRIEF DESCRIPTION OF THE DRAWINGS

Embodiments of the present invention will be described below with reference to the accompanying drawings, in which.

DETAILED DESCRIPTION OF PREFERRED EMBODIMENTS

Figure 1:
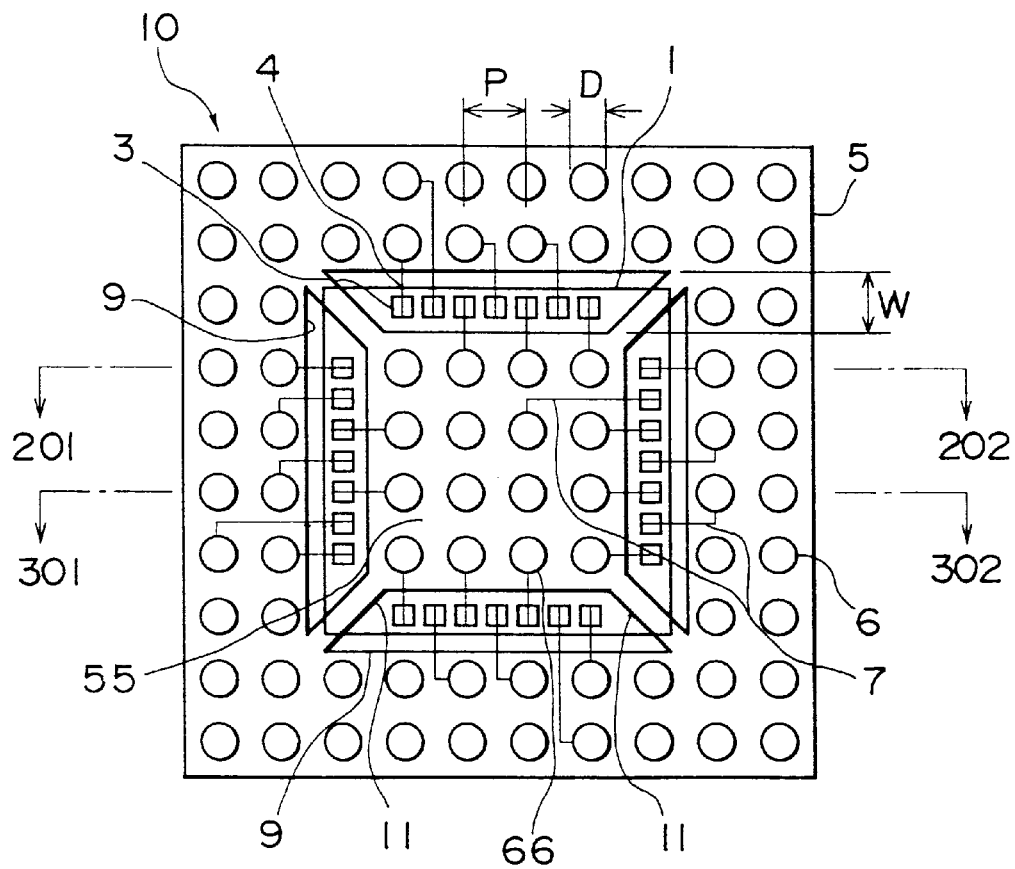
FIG. 1 is a plan view of an integrated circuit device in accordance with an embodiment of the invention.
Figure 2:
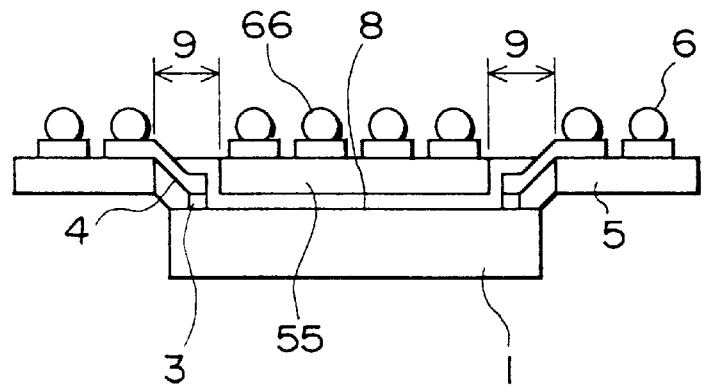
FIG. 2 is a cross-sectional view taken along line 201-202 of FIG. 1.
Figure 3:
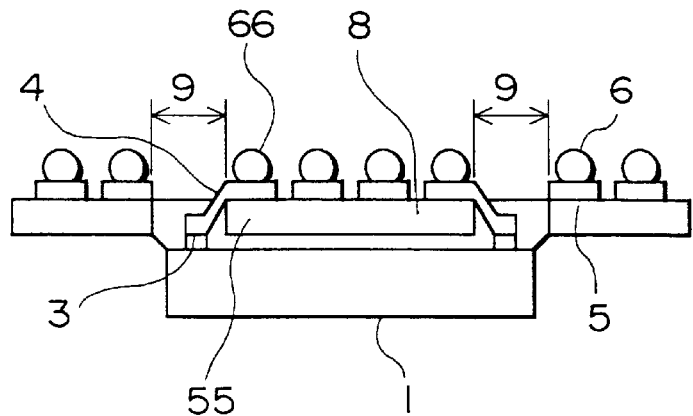
FIG. 3 is a cross-sectional view taken along line 301-302 of FIG. 1.

FIG. 1 is a plan view of an integrated circuit device of the invention, viewed from a side thereof for connecting to an external substrate, FIG. 2 is a cross-sectional view taken along line 201-202 of FIG. 1, and FIG. 3 is a cross-sectional view taken along line 301-302 of FIG. 1. An integrated circuit device 10 in accordance with the invention shown in these figures is formed from an integrated circuit element 1 and electrodes 3 of the integrated circuit element 1; a carrier film having inner leads 4, wire leads 7, external electrodes 6, 66 defining external terminals, and films 5, 55; and sealing resin 8 which covers at least the integrated circuit element 1 and a part of the films 5, 55.

Figure 4:
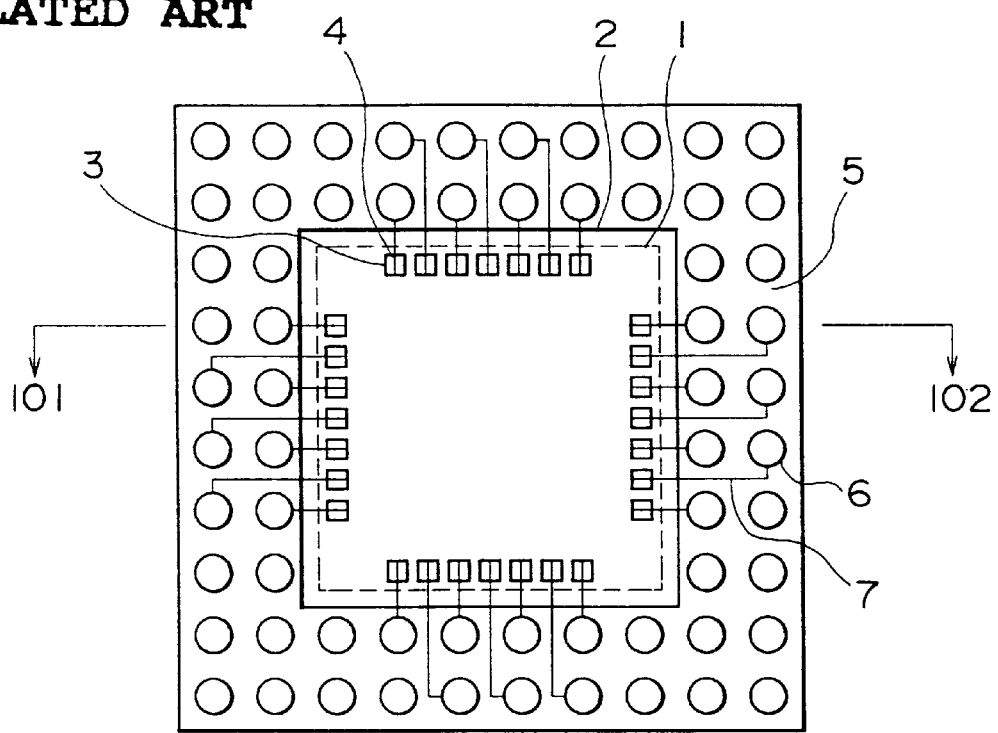
FIG. 4 is a plan view of a conventional integrated circuit device.
Figure 5:
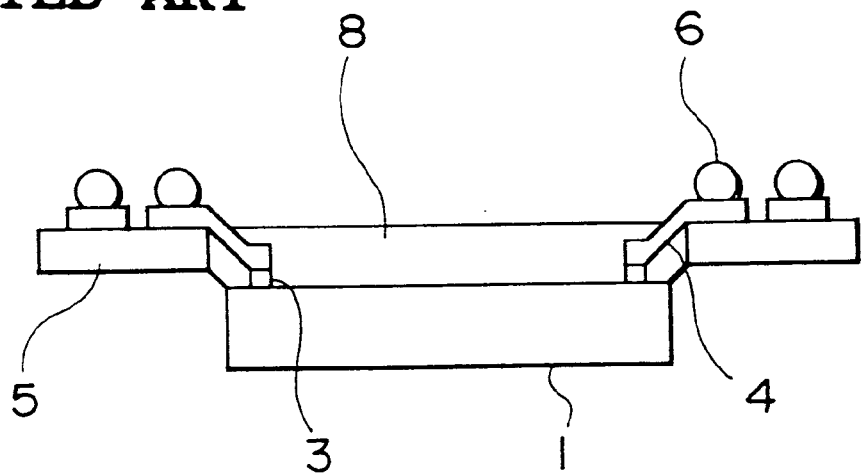
FIG. 5 is a cross-sectional view taken along line 101-102 of FIG. 4.

The external electrodes 6, 66 and the wire leads 7 are disposed on films 5, 55. The films 5, 55 are separate. The film 55 defines a first region in which the integrated circuit element 1 is disposed, and the film 5 defines a second region external to the first region. The first region, the film 55, is defined by an area located within groups of the electrodes 3 that are continuously formed on the integrated circuit element 1. On the other hand, the second region, the film 5, is defined by an area located outside of the group of the electrodes 3. The first region and the second region are discriminated from one another based on their relative positions with respect to the group of the electrodes 3. The first region overlaps with the region of the integrated circuit element 1. However, the second region may overlap with the region of the integrated circuit element 1 in some cases or may not overlap with the region of the integrated circuit 1 device at all in other cases. Furthermore, the external electrodes 66, 6 are disposed on the film 55 and the film 5, respectively. In other words, the film 55 for disposing the external electrodes 66 is provided within the area corresponding to the device hole 2 of the related art as shown in FIG. 4. Moreover, the external electrodes 66, 6 are disposed in a manner to form a common matrix.

Because the external electrodes 66 are provided in an area corresponding to the related art device hole, connections to an external substrate can be made even within a region corresponding to the integrated circuit element 1. Accordingly, the number of external electrodes in an area occupied by the package is substantially increased, and substantially many more connections can be made in a specified mounting area, compared to the conventional structure. Moreover, as the same process required for the conventional structure can be used for the manufacture, mounting with a substantially higher-density is realized with the same number of steps required for the conventional structure, and without requiring any new techniques. Furthermore, the external electrodes 66, 6 are disposed in a manner to form a common matrix. As a result, even when the size of an integrated circuit element differs, the same socket and the same substrate can be used to examine the integrated circuit device. Accordingly, the socket and the substrate need not be changed and the examination process is simplified.

The number of the external electrodes 66 formed on the film 55 is less than the number of the external electrodes 6 formed on the film 5. As a result, because the external electrodes 66 and the external electrodes 6 are disposed having the same pitch, a mounting substrate and an examination socket can be commonly used, and the size of the integrated circuit element 1 can be reduced to its minimum. Conversely, if the number of the external electrodes 66 is the same as or more than the number of the external electrodes 6, the size of the integrated circuit element 1 may have to be increased, or the pitch of the external electrodes 66 may have to be smaller than the pitch of the external electrodes 6. As a consequence, a mounting substrate and a socket cannot be commonly used.

In a border region between the film 55 and the film 5, a connection hole 9 for connecting the electrodes 3 of the integrated circuit element 1 and the external electrodes 66, 6 is formed along each of the edges of the integrated circuit element 1. The film 55 and the film 5 are connected to one another by bridge sections 11 that separate the connection holes 9 at corners of the integrated circuit element 1. It is noted that the bridge sections 11 are most preferably provided at the four corners, as shown in FIG. 1, in consideration of the supporting strength thereof and routing locations of the inner leads 4. However, the bridge sections 11 are not necessarily provided at all four corners. For example, the bridge sections 11 may be provided only at two diagonally opposing corners, or another corner may be added so that the bridge sections 11 are provided at three locations. Also, the bridge sections may be provided in areas that traverse the connection holes. Such selections may be made based on the locations at which the electrodes 3 and the inner leads 4 are disposed. The width W of each of the connection holes 9 is varied based on the diameter of the external electrodes 66, 6 and the pitch between the external electrodes. When the diameter of each of the external electrodes 66, 6 is D, and the pitch between each adjacent ones of the external electrodes 66, 6 is P, the width W is determined by:

$$W=(P-D) \text{ to } (2P-D).$$

The wire leads 7, for connecting the external electrodes 66, 6 and the inner leads 4, are formed on one surface of the films 55, 5. The inner leads 4 connect the electrodes 3 that are disposed generally in a row along each edge of the integrated circuit element 1 and the external electrodes 66, 6. Therefore, the inner leads 4 protrude through the connection holes 9 in the form of cantilevers. Each inner lead 4 has one end connected to a one of the electrodes 3 of the integrated circuit element 1 and the other end connected, through a wire lead 7, to a one of the external electrodes 66 in the first region or a one of the external electrodes 6 in the second region. Accordingly, the electrodes 3 of the integrated circuit element 1 and the inner leads 4 are arranged generally in a row along each of the edges of the integrated circuit element 1. As a result, the connection region for the integrated circuit 1 and the inner leads 4 can be reduced to a minimum required size.

The direction in which the inner leads 4 extend from the connection holes 9, in other words, locations at which the wire leads 7 connected to the inner leads 4 are disposed, may be appropriately decided. For example, the inner leads 4 may be protruded alternately toward the film 55 and the film 5, or may be protruded in a different manner. It is noted that when the inner leads 4 are protruded alternately from the film 55 and the film 5, the pitch between adjacent ones of the inner leads 4 can be widened, compared to the case when the inner leads 4 are protruded from one side. Accordingly, connection reliability is improved.

The inner leads 4 may be modified to bridge across the connection hole 9 and may be supported at both ends of the inner leads 4 for connecting to the electrodes 3. When both ends of the inner leads 4 are supported, the inner leads 4 do not have free ends and are securely fixed. As a result, the inner leads 4 are substantially stronger against bending force. Also, when both ends of the inner leads 4 are supported, wire leads 7 to be connected to the corresponding inner leads 4 may be further extended so that the inner leads 4 can be routed on both of the film 55 and the film 5. As a result, external electrodes 66, 6 may be provided on one of the film 55 and the film 5, and common wire may be routed on the other of the films. The common wire is preferably used for, for example, a power source, ground and the like that have common potentials. The connection holes 9 may be provided with wire leads which are not connected to the electrodes 66, 6 or with dummy leads that do not have an electrical contribution.

In the principal embodiment described above, the electrodes 3 of the integrated circuit element 1 and the inner leads 4 are arranged generally in a single row along each of the edges of the integrated circuit element 1 in order to minimize the connection region for the inner leads 4. However, a variety of modifications are possible. For example, the electrodes 3 may be arranged in two rows along each of the edges of the integrated circuit element 1. In this case, the inner leads 4 may be extended in appropriate directions depending on the design requirements. As an example, the electrodes 3 in an outer row, that is, located closer to the edge of the integrated circuit element 1 are connected to the inner leads 4 that extend toward the film 5, and the electrodes in the other row, that is, located farther from the edge of the integrated circuit element 1, are connected to the inner leads 4 that extend toward the film 55. In another embodiment, the electrodes may be arranged in three or more rows.

In the embodiment described above with reference to FIG. 1, the pitch P of the external electrodes 66, 6 is twice as large as the pitch of the electrodes 3. However, the external electrodes 66, 6 and the electrodes 3 may be disposed in the same pitch so that they form a common matrix. When the external electrodes 66, 6 and the electrodes 3 of the integrated circuit element 1 have the same pitch, the integrated circuit device 10 can be further miniaturized.

A method of manufacturing a carrier film and an integrated circuit device 10 in accordance with the invention will now be described.

First, the integrated circuit element 1 will be described. The electrodes 3 of the integrated circuit element 1 include gold bumps formed by a plating method on aluminum pads through a barrier metal. Alternatively, when the bumps are formed on the inner leads 4 on the carrier film, the electrodes 3 are left without modification to the aluminum pads.

The film 5 defining a carrier film is made from a heat resistant resin film, such as, for example, a polyimide film, a polyetherimide resin film, a glass epoxy woven cloth, a polyester film and the like, having a thickness of 25 micro-millimeters to 125 micro-millimeters in the form of a tape. The film 5 is coated with adhesive, and then heated to half-harden the adhesive. Then, at least one connection hole 9 for connecting the electrodes 3 of the integrated circuit element 1 and the inner leads 4 is opened by a punch method, using a metal mold. When an adhesive is not used, the connection hole 9 may be opened by an etching method.

Then, a copper foil in the form of a tape having a thickness of 15 to 35 micro-millimeters is adhered to the tape-like film with adhesive spread thereon by applying heat and pressure.

A photoresist is coated on the copper foil, and a protection resist is coated on a surface of the film 5 on the opposite side of the copper foil to cover the connection holes 9. Then, the photoresist and the protection resist are dried.

The photoresist is then exposed, using a photomask having a predetermined pattern formed thereon, developed and etched to form the inner leads 4 and the wire leads 7.

The photoresist and the protection resist are removed, and tin or gold is plated on the inner leads 4. Then, solder resist may be coated on areas other than the regions in which the connection holes 9 and the external electrodes 6 or 66 are provided to prevent short-circuits by the solder which may be used when the external electrodes 6 or the external electrodes 66 and an external substrate are connected to one another, and to protect the wire leads 7.

Lastly, the carrier film is completed by melt-attaching solder balls to the films 55, 5 to serve as the external terminals 66, 6. Alternatively, copper bumps are formed on the external electrodes 66 and the external electrodes 6 by a plating method, and surfaces of the copper bumps are covered by gold plating or solder plating to serve as the external terminals 66, 6. It is noted that the external electrodes 66, 6 can be formed after the integrated circuit element 1 is mounted. Also, only connection lands for external terminals may be formed on the carrier film, and terminals in the form of balls or bumps may be formed on an external substrate.

Next, a method of manufacturing an integrated circuit device using a carrier film that is manufactured by the method described above.

First, the electrodes 3 of the integrated circuit element 1 and the inner leads 4 of the carrier film are aligned with one another, and connected by the application of heat and pressure, using a connection tool. When the electrodes 3 are formed from gold bumps and the inner leads 4 are plated with tin, the connecting sections are heated at a temperature ranging from about 350° C. to about 450° C. for about 0.5 seconds while a pressure is applied to thereby complete the connection.

Next, liquid epoxy resin is applied for resin sealing. The resin sealing is performed by the dispense method by which drops of the resin are dripped on the surfaces to draw a controlled pattern. The sealing range covers the top surface and side surfaces of the integrated circuit element 1, the interior of the connection holes 9 and areas of the films 55, 5 adjacent the integrated circuit element 1. Then, the liquid resin is heated at 150° C. for about two hours. As a result, the liquid resin hardens to form the sealing resin 8.

The sealing resin 8 may also be applied to the rear surface of the integrated circuit element 1 and, also, generally to the entire front surface of the polyimide of the film 5. Alternatively, the sealing resin may be formed by the transfer forming method or the injection forming method without using liquid resin.

As described above, in accordance with the invention, external electrodes can be disposed in an area corresponding to a conventional device hole section, and therefore connection to an external substrate can be made in a region corresponding to an integrated circuit element. Accordingly, the number of external electrodes in an area occupied by the package is substantially increased, and substantially many more connections can be made in a specified mounting area, compared to the conventional structure. Moreover, since the same process required for the conventional structure can be used for the manufacture, mounting with substantially higher-density is realized with the same number of steps required for the conventional structure, and without requiring any new techniques. Furthermore, the external electrodes in the first region and the external electrodes in the second region are disposed in a common matrix. As a result, even when the size of an integrated circuit element differs, the same socket and the same substrate can be used to examine the integrated circuit device. Accordingly, the socket and the substrate are not required to be changed, and therefore the examination process is simplified.

What is claimed is:

1. A carrier film in which a plurality of inner leads to be connected to electrodes of an integrated circuit element are disposed to protrude into a connection hole defined in a thin, flexible heat resistant resin film, the inner leads extending on the film to define wire leads, the wire leads being directly connected to external electrodes disposed in a plane on one surface of the thin, flexible heat resistant resin film, the carrier film comprising:

a first region adjacent an area in which the integrated circuit element is disposed;

a second region external to and surrounding at least a portion of the first region, the connection hole defined in a border area between the first region and the second region along a portion of the integrated circuit element, the external electrodes provided on the first region and the second region, and the external electrodes on the first region and the second region disposed in a common matrix, wherein the thin, flexible heat resistant resin film has a thickness of 25 micro-millimeters to 125 micro-millimeters and the wire leads are made from material containing copper, only opposing surfaces of the integrated circuit element and a portion the thin, heat flexible resistant resin film adjacent the integrated circuit element and the area therebetween are sealed by resin; and the connection hole is formed to have a width W that is defined by $W=(P-D)$ to $(2P-D)$, where D is a diameter of the external electrode and P is a pitch between adjacent ones of the external electrodes, the connection hole also filled with resin.

2. The carrier film according to claim 1, wherein the number of the external electrodes formed in the first region is less than the number of the external electrodes formed in the second region.

3. The carrier film according to claim 1, wherein the electrodes of the integrated circuit element are disposed within the matrix formed by the external electrodes.

4. An integrated circuit device in which electrodes of the integrated circuit element are connected to the inner leads, the integrated circuit device comprising the carrier film according to claim 1.

5. The carrier film according to claim 1, wherein the number of the external electrodes formed in the first region is less than the number of the external electrodes formed in the second region.

6. The carrier film according to claim 1, wherein the electrodes of the integrated circuit element are disposed within the matrix formed by the external electrodes.

7. An integrated circuit device in which electrodes of the integrated circuit element are connected to the inner leads, the integrated circuit device comprising the carrier film according to claim 1.

8. The carrier film according to claim 2, wherein the electrodes of the integrated circuit element are disposed within the matrix formed by the external electrodes.

9. An integrated circuit device in which electrodes of the integrated circuit element are connected to the inner leads, the integrated circuit device comprising the carrier film according to claim 2.

10. An integrated circuit device in which electrodes of the integrated circuit element are connected to the inner leads, the integrated circuit device comprising the carrier film according to claim 3.

11. A method of manufacturing an integrated circuit device as claimed in claim 1, comprising steps of:

forming at least one hole in a thin flexible, heat resistant resin film, the hole dividing a first region from a second region around the first region in the thin flexible, heat resistant resin film;

adhering an electrically conductive foil to the thin flexible, heat resistant resin film, the electrically conductive foil covering the first and second regions and the hole;

forming a plurality of wire leads, ones of the wire leads extending from the first region into the hole, the others of the wire leads extending from the second region into the hole;

forming a plurality of receiving portions for external electrodes on the first and second regions, each of the receiving portions directly connected to one of the plurality wire leads, the receiving portions disposed in a matrix;

positioning an integrated circuit element having a plurality of electrodes at its outer periphery, the electrodes positioned in the hole;

connecting the wire leads to the electrodes of the integrated circuit element; and sealing at least connected portions of the wire leads and the electrodes with a resin.

12. The method of claim 11, further comprising a step of attaching a solder ball to each of the receiving portions to make the external electrodes.

13. The method of claim 11, wherein the electrodes of the integrated circuit element are disposed in the matrix where the receiving portions are disposed.

* * * * *